United States Patent [19]
Thornton et al.

[11] Patent Number: 5,386,428
[45] Date of Patent: Jan. 31, 1995

[54] STACKED ACTIVE REGION LASER ARRAY FOR MULTICOLOR EMISSIONS

[75] Inventors: Robert L. Thornton, East Palo Alto; Kevin J. Beernink, Mountain View, both of Calif.

[73] Assignee: Xerox Corporation, Stamford, Conn.

[21] Appl. No.: 146,651

[22] Filed: Nov. 2, 1993

[51] Int. Cl.⁶ .............................. H01S 3/19
[52] U.S. Cl. ................. 372/50; 257/14; 377/45; 377/23
[58] Field of Search ............ 372/23, 45, 46, 50; 257/13, 14, 15

[56] References Cited

U.S. PATENT DOCUMENTS

| | | | |
|---|---|---|---|
| 4,982,408 | 1/1991 | Shimizu | 372/45 |
| 5,033,053 | 7/1991 | Shimizu et al. | 372/50 |
| 5,157,680 | 10/1992 | Goto | 372/50 |
| 5,157,682 | 10/1992 | Shimada | 372/50 |
| 5,212,706 | 5/1993 | Jain | 372/50 |

OTHER PUBLICATIONS

Ikeda, S.; Shimizu, A.; and Hara, T. "Asymmetric Dual Quantum Well Laser—Wavelength Switching Controlled by Injection Current." Appl. Phys. Lett., vol. 55, No. 12, 18 Sep. 1989. pp. 1155–1157.
Ikeda, S.; and Shimizu, A. "Evidence of the Wavelength Switching Caused by a Blocked Carrier Transport in an Asymmetric Dual Quantum Well Laser." Appl. Phys. Lett., vol. 59, No. 5, 29 Jul. 1991. pp. 504–506.

Primary Examiner—James W. Davie
Attorney, Agent, or Firm—John M. Kelly

[57] ABSTRACT

Monolithic arrays having closely spaced laser stripes which output laser beams with large, but well-controlled, wavelength separations. The monolithic array uses a plurality of stacked active regions which are stacked in the order of decreasing energy bandgaps as one moves away from the substrate. Those active regions are separated by one or more thin etch stop layers. Between the bottom active regions and the substrate is a lower cladding layer, while over the topmost active region of each stack is an upper cladding layer. Beneficially, an electrical connection is made to each stack using a heavily doped capping layer/metallic contact above each stack and a metallic contact on the substrate (which is shared by all stacks). Lateral carrier and optical confinement is achieved using a confinement layer which surrounds each stack. Beneficially, that confinement layer is formed using layer induced disordering.

12 Claims, 6 Drawing Sheets

| 111 | GaAs | p=2×10¹⁹ | 1000Å | CAP |
|---|---|---|---|---|
| 110 | $Al_{0.85}Ga_{0.15}As$ | p=10¹⁸ | 0.6 um | CLADDING |
| 109 | $Al_{0.15}Ga_{0.85}As$ | p=10¹⁸ | 50Å | ESL1 (<730 nm) |
| 108 | $Al_{0.30}Ga_{0.70}As$ | u | 900Å | |
| 107 | GaAs | u | 100Å | QW1 850 nm |
| 106 | $Al_{0.30}Ga_{0.70}As$ | u | 250Å | |
| 105 | $Al_{0.85}Ga_{0.15}As$ | u | 40Å | ESL2 |
| 104 | $Al_{0.15}Ga_{0.85}As$ | u | 50Å | ESL3 (730 nm) |
| 103 | $Al_{0.40}Ga_{0.60}As$ | u | 900Å | |
| 102 | $Al_{0.10}Ga_{0.90}As$ | u | 80Å | QW2 780 nm |
| 101 | $Al_{0.40}Ga_{0.60}As$ | u | 900Å | |
| 100 | $Al_{0.85}Ga_{0.15}As$ | n=10¹⁸ | 0.8 um | CLADDING |
| 98 | $Al_{0.40}Ga_{0.60}As$ | n⁺ | 2000Å | BUFFER LAYER |
| 96 | $Al_{0.15}Ga_{0.85}As$ | n⁺ | 2000Å | BUFFER LAYER |
| | GaAs | n⁺ | | SUBSTRATE |

*FIG. 4*

STACKED ACTIVE REGION LASER ARRAY FOR MULTICOLOR EMISSIONS

This invention relates to solid-state laser arrays which output multiple laser beams having different colors (wavelengths).

BACKGROUND OF THE INVENTION

The performance of many devices, such as laser printers and optical memories, can be improved by the incorporation of multiple laser beams. For example, laser printers which use multiple beams can have higher printing speeds and/or better spot acuity than printers which use only a single beam.

In many applications, closely spaced laser beams of different colors (wavelengths) are desirable. For example, color printers which use closely spaced laser beams of different colors can overlap the beams, sweep those overlapping beams using a single raster output polygon scanner and a single set of optics, subsequently separate the individual beams using color selective filters, direct each beam onto a separate xerographic imaging station, develop a latent image for each color on a different recording medium, and produce a full color image by sequentially developing each latent image on a single recording medium.

One way to obtain closely spaced laser beams is to form multiple laser emission sites, or laser stripes, on a common substrate. While this enables very closely spaced beams, prior art monolithic laser arrays typically output laser beams at only one color.

However, various techniques are known in the prior art for producing different color laser beams from a monolithic laser array. For example, it is well known that a small amount of color difference can be obtained by varying the drive conditions at each lasing region. However, the easily achievable color difference is insufficient for most applications.

One method of achieving large wavelength separations is to grow a first set of active layers on a substrate to form a first lasing element which outputs light at one wavelength, and then to form a second set of active layers next to the first to form a second lasing element at a second wavelength. However, this method requires separate crystal growths for each lasing element, something which is not easily performed.

Another technique for obtaining different color laser beams from a monolithic laser array is to use stacked active regions. A stacked active region monolithic array is one in which a plurality of active regions are sandwiched between common cladding layers. Each active region is comprised of a thin volume that is contained within a laser stripe. The laser stripes contain different numbers of active regions that emit laser beams at different wavelengths. Several stacked active region structures are discussed in U.S. Pat. No. 5,157,680, entitled "Integrated Semiconductor Laser," issued 20 Oct. 1992 to Goto.

In a stacked active region monolithic laser array, current flows in series through the stacked active regions. The active region with the lowest bandgap energy will lase, thereby determining the color of the laser beam output from that part of the array. To provide another color output, the previously lowest bandgap energy active region is removed from part of the array and current is sent through the remaining stacked regions.

Stacked active region monolithic laser arrays can not only output closely spaced laser beams of different colors, but beneficially the output laser beams are axially aligned with each other (share the same optical axes). In practice, the stacked regions of a stacked active region monolithic laser array are very closely spaced; separations in the stack direction typically being about 100 nm.

A big problem with stacked active region monolithic laser arrays is that they have been difficult to fabricate, particularly in the AlGaAs material system. This is at least partially because the proper stacked active regions must be formed in each part of the structure. Conceptually, this problem can be solved by simply growing planar epitaxial layers which contain the required active regions such that the bandgap energies of the active regions decrease as one moves towards the crystal surface. Then, one could simply remove active regions, as required, to obtain the desired wavelength from each region of the array. Finally, the required cladding layer and capping layers are grown over the remaining active regions.

However, it is very difficult to precisely etch the areas between the active regions when those active regions are closely spaced. Further, because of undesired growths on many materials when those materials are exposed to air, such as oxide growths on some compositions of AlGaAs, it is very difficult to achieve the required high quality growths over the remaining active regions. Thus, the simple conceptual approach given above is difficult to implement in some material systems, for example those containing aluminum.

Therefore, it would be useful to have stacked active region structures capable of outputting closely spaced, multiple color laser beams. It would also be useful to have techniques for producing stacked active region structures capable of outputting closely spaced, multiple color laser beams in material systems which are subject to undesired oxidation upon exposure to the atmosphere prior to growth of overlayers.

SUMMARY OF INVENTION

An object of the invention is a stacked active region structure capable of outputting closely spaced, multiple color laser beams.

Another object of the invention is to produce closely spaced, multiple color laser beams in a device which is nearly planar.

Another object is a technique for producing stacked active region structures capable of outputting closely spaced, multiple color laser beams.

Yet another object is a technique for producing stacked active region structures which requires only two epitaxial crystal growth steps.

A further object of the invention is a device capable of producing closely spaced, multiple color laser sources that are axially aligned with each other.

The invention relates to monolithic arrays, and techniques for fabricating such arrays, which have closely spaced laser stripes and which output laser beams with large, but well-controlled, wavelength separations. The monolithic array has a plurality of stacked active regions which are stacked in the order of increasing energy bandgaps as one moves toward the substrate. Those active regions are separated by one or more thin etch stop layers. Between the bottom active regions and the substrate is a lower cladding layer, while over the topmost active region of each stack is an upper cladding layer. Beneficially, an electrical connection is made to each stack using a heavily doped capping layer/metallic contact above each stack and a metallic contact on the substrate (which is shared by all stacks). Lateral carrier and optical confinement, for enhanced performance, is achieved using a confinement layer which surrounds each stack. Beneficially, that confinement layer is formed using impurity-induced layer disordering.

A method of fabricating such monolithic arrays is to first fabricate all active regions (in order of wavelength), lower cladding layer, and etch stop layers on a single substrate. Then, using patterned etching, the various active layers are removed (etched) from selected portions of the structure such that the top active region that remains in each stack will output the desired color. The etch stop layers enable the accurate removal of the undesired active regions without harm to the topmost remaining active region in each stack. Then the upper cladding layer and capping structure are grown over the topmost portions of the structure. Next, a lateral confinement region is created, beneficially using impurity-induced layer disordering. Finally, the metallic contacts are added to each stack and to the substrate.

The advantages of the invention will become more apparent from the following drawings and descriptions.

BRIEF DESCRIPTION OF THE DRAWINGS

FIG. 4 shows an intermediate structure in the fabrication of the structure illustrated in FIG. 1, that intermediate structure is the one that exists prior to any etching steps;

AN ILLUSTRATED EMBODIMENT

The present invention provides for stacked active region monolithic arrays, and techniques for producing such arrays, that are capable of outputting closely spaced, multiple color, axially aligned laser beams. A benefit of the present invention is that it enables stacked active region monolithic arrays in material systems, such as the $Al_xGa_{1-x}As$ material system, in which high quality growths are difficult to achieve, for example, growths on aluminum containing layers. Another material system in which the present invention may find wide use is $In_xGa_yAl_{1-x}As$, wherein $0 \leq x \leq 1$ and $0 \leq y \leq 1$.

The following detailed description describes an embodiment of a stacked active region structure according to the present invention. First, a description of the structure itself is provided. Then, the operation of the structure (as currently understood) is described. Finally, a process of fabricating the structure is provided. It is to be understood that many other embodiments than the one illustrated are possible.

DESCRIPTION OF THE ILLUSTRATED EMBODIMENT

Figure 1:
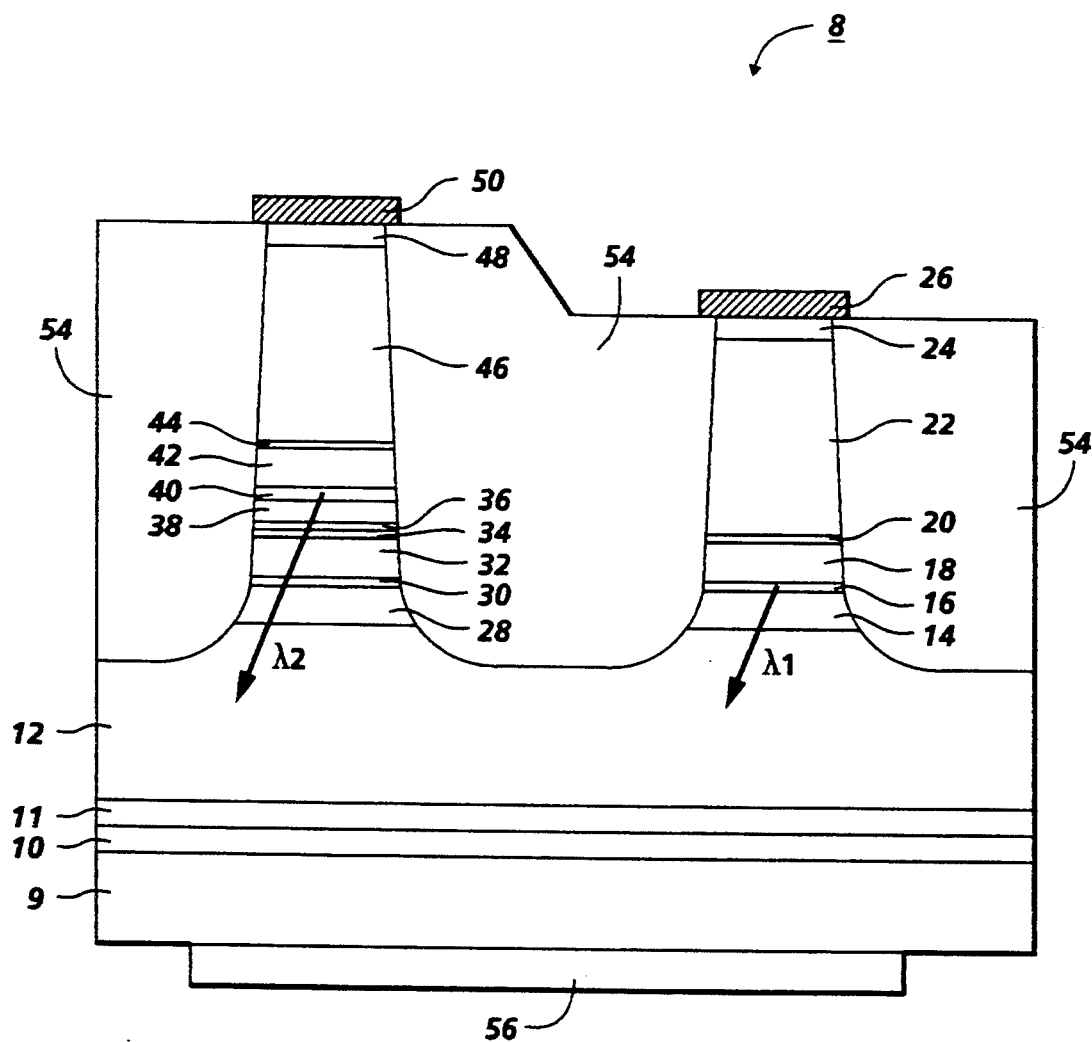
FIG. 1 is an unscaled schematic depiction of a cross-sectional view of a structure that is in accordance with the invention.

FIG. 1 illustrates a simplified, stacked active region monolithic array 8 in accord with the principles of the invention. While the array 8 outputs only two laser beams, the principles of the invention can be applied to arrays which output additional laser beams.

The array 8 is a layered arrangement of $Al_xGa_{1-x}As$, GaAs, and metallic contacts. The use of $Al_xGa_{1-x}As$ on GaAs substrates is well known for the production of lasers having wavelengths in the range of around 700 to 900 nm.

The array 8 has a substrate 9 comprised of a GaAs base onto which are grown (using MOCVD) a 2000Å thick buffer layer 10 of $Al_{0.15}Ga_{0.85}As$ followed by a 2000Å thick $Al_{0.40}Ga_{0.60}As$ buffer layer 11, both of which are heavily doped n-type (doping greater than $10^{18}$ cm$^{-3}$). Over the buffer layer 11 is a 0.8 μm thick $Al_{0.85}Ga_{0.15}As$ lower cladding layer 12 which is doped to about n=$10^{18}$ cm$^{-3}$. Because the array 8 outputs two laser beams, two stacks of active regions and support layers are formed over the lower cladding layer 12. While the subsequently described first stack contains only one active region, and is therefore technically not a stacked active region, it will be referred to as a stack since, in other applications, it may contain more than one active region. As used herein, an active region is one or more layers capable of providing optical gain at a color of interest from the array.

THE FIRST STACK

Still referring to FIG. 1, the first stack begins with an approximately 900Å thick waveguide layer 14 of $Al_{0.40}Ga_{0.60}As$ over the lower cladding layer 12. Over the waveguide layer 14 is an 80Å thick quantum well layer 16 of $Al_{0.10}Ga_{0.90}As$ (for emission at a first wavelength of 780 nm). Over the quantum well layer 16 is a 900Å thick waveguide layer 18 of $Al_{0.40}Ga_{0.60}As$. The various layers 14, 16, 18 form a first active region.

Over the waveguide layer 18 is a 50Å thick etch stop layer 20 that is comprised of $Al_{0.15}Ga_{0.85}As$. Over the etch stop layer 20 is an 0.6 μm thick $Al_{0.85}Ga_{0.15}As$ upper cladding layer 22 that is doped to about p=$10^{18}$ cm$^{-3}$. Over the upper cladding layer 22 is a 1000Å thick capping layer 24 of GaAs which is doped to about p=$2 \times 10^{19}$ cm$^{-3}$. Finally, over the capping layer 24 is a metal contact 26 that provides electrical access to the first stack.

THE SECOND STACK

The second stack begins with an approximately 900Å thick waveguide layer 28 of $Al_{0.40}Ga_{0.60}As$ over the lower cladding layer 12. Over the waveguide layer 28 is an 80Å thick quantum well layer 30 of $Al_{0.10}Ga_{0.90}As$. Over the quantum well layer 30 is a 900Å thick waveguide layer 32 of $Al_{0.40}Ga_{0.60}As$. The various layers 28, 30, and 32 form a second active region. Note that the first and second active regions are essentially the same in that the layers 28, 30, and 32 are the same as, respectively, layers 14, 16, 18. However, as subsequently explained, the second active region does not emit laser light.

Over the waveguide layer 32 is a 50Å thick etch stop layer 34 comprised of $Al_{0.15}Ga_{0.85}As$. Note that the etch stop layers 20 and 34 are the same. Importantly, over the etch stop layer 34 is a 40 Å thick etch stop 36 comprised of $Al_{0.85}Ga_{0.15}As$.

A third active region is then formed over the etch stop 36. That third active region is formed from a 250Å thick waveguide/separation layer 38 of $Al_{0.30}Ga_{0.70}As$. Over the waveguide/separation layer 38 is a 100Å thick GaAs quantum well layer 40 for emission at 850 nm. Completing the third active layer is a 900Å thick waveguide layer 42 of $Al_{0.30}Ga_{0.70}As$ over the GaAs layer 40. the etch stop layer 44 is a 6000Å thick $Al_{0.85}Ga_{0.15}As$ upper cladding layer 46 that is doped to about $p = 10^{18}$ cm$^{-3}$. Over the upper cladding layer 46 is a 1000Å thick capping layer 48 of GaAs which is doped to about $p = 2 \times 10^{19}$ cm$^{-3}$. Finally, over the capping layer 48 is a metal contact 50. Note that the upper cladding layer 46, capping layer 48, and metal contact 50 are similar to, respectively, the upper cladding layer 22, capping layer 24, and metal contact 26.

OTHER ELEMENTS OF THE ILLUSTRATED EMBODIMENT

Over the sections of the lower cladding 12 that are not part of either the first or second stacks are lateral confining regions 54. In the array 8, the confining regions 54 are formed by impurity-induced disordering. Finally, a common electric contact 56 provides a common electrical path for the first and second stacks.

OPERATION OF THE ILLUSTRATED EMBODIMENT

To emit light from the array 8, independent current sources are applied via the metallic contacts 26 and 50 through the first and second stacks, respectively, to the common metallic contact 56.

The current through the first stack causes electron-hole recombinations in the first active region (layers 14, 16, and 18), mainly in the quantum well layer 16. Laser operation takes place on the transition between the confined electron and hole states in the quantum well. Lateral current confinement and lateral optical confinement are provided by the confining regions 54 adjacent the first stack. Additional optical confinement is provided by the lower cladding layer 12 and by the upper cladding layer 22. The capping layer 24 provides electrical interfacing between the metallic contact 26 and the upper cladding layer 24. While not shown, an optical cavity (formed by cleaved facets) provides the required optical feedback.

Current through the second stack passes in series through the second and third active regions. When multiple active regions are stacked over a common lower cladding layer, with the topmost region having the longest wavelength, the topmost region will lase. This strategy relies on the concept that carriers preferentially populate the narrowest bandgap layer in a stacked structure.

Figure 2:
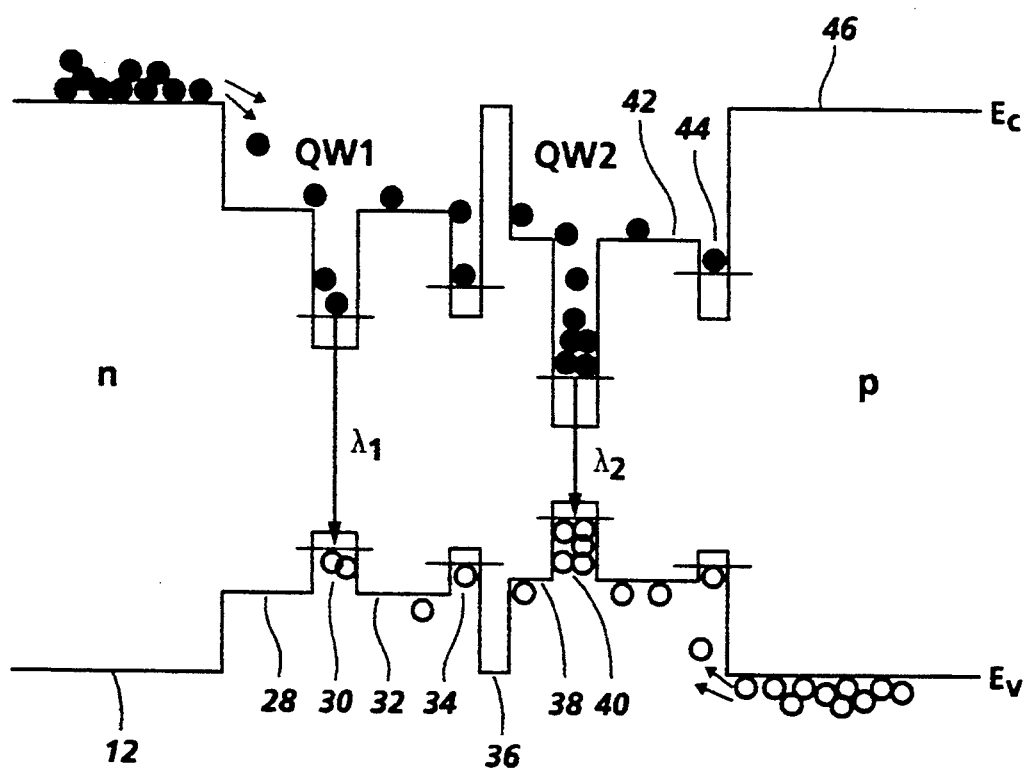
FIG. 2 shows the energy bands for part of the structure in FIG. 1 so as to illustrate the electron and hole populations of the quantum wells.

A bandgap diagram for the second stack of the structure shown in FIG. 1 is presented in FIG. 2. With current flow, electrons and holes populate the various regions as shown. Because the compositions and dimensions of the second stack vary along the stack, electrons and holes, which seek their lowest energy state, populate the quantum well 40 preferentially over the quantum well 30. Because of the much higher electron and hole densities in the lower bandgap quantum well 40 as compared to the quantum well 30, given sufficiently low threshold gain, laser operation takes place on the transition between confined electron and hole states in quantum well 40. Only a much smaller amount of spontaneous emission is emitted from the quantum well 30. Lateral current confinement and lateral optical confinement are provided by the confining regions 54 adjacent the second stack.

Figure 3:
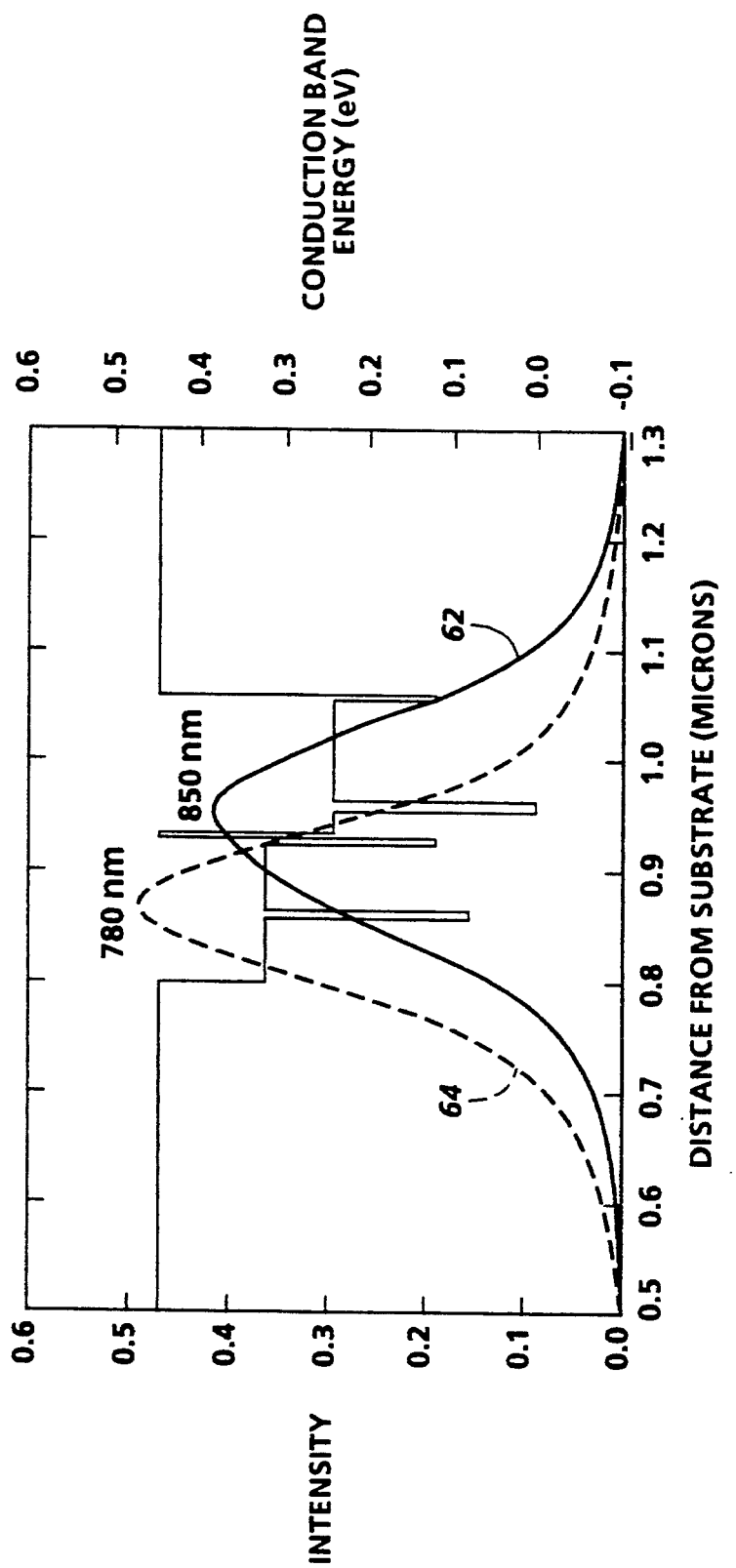
FIG. 3 shows the conduction band and optical intensities of the waveguide modes at the two colors output by the second stack of the structure illustrated in FIG. 1.

FIG. 3 illustrates vertical optical confinement in the array 8. For the second stack, which has a longer wavelength of operation, an optical waveguide mode 62 is achieved as a result of optical waveguiding within the waveguide core formed by the layers 28 through 44, inclusive, which are bounded by the cladding layers 12 and 46. For the first stack, which has a shorter wavelength of operation, an optical mode 64 is achieved by the layers 14 through 20, inclusive, which are bounded by the cladding layers 12 and 22. It is important that the long wavelength optical mode 62 has a relative maximum very close to the long wavelength quantum well (layer 40), and also that the short wavelength optical mode 64 has a relative maximum near the short wavelength quantum well (layer 16). These positions relative to the quantum wells result in maximum overlap factor of the optical mode with the quantum well for optical mode amplification, resulting in optimal laser threshold characteristics.

It should be noted that the etch stop layers 34 and 44 in FIG. 2 also form quantum wells. These quantum wells are not necessary for the operation of the array 8. They result from the desirability of having low-aluminum fraction layers exposed prior to the final growth step (see below). The thicknesses and compositions of these layers are chosen such that the confined energy states for the electrons and holes in all etch stop layers in a stack lie above those in the quantum well from which laser emission is desired. This helps ensure that the electrons and holes preferentially populate the desired quantum well.

FABRICATION

Problems with prior art stacked active region monolithic arrays are frequently a result of the difficulties of precisely etching to the correct location between active regions, and of achieving high quality growths on the topmost surfaces after etching, particularly in material systems such as AlGaAs that tend to oxidize. Our solution to these problems is to include "etch stop layers" between the stacked active regions that enable precise etching and subsequent high quality growths of the desired compositions. It is to be understood that while the following fabrication process describes the fabrication of only three active regions (only two of which are stacked) the fabrication process is easily expanded to include more stacked regions.

The initial step in fabricating the structure shown in FIG. 1 is to grow the structure shown in FIG. 4 using a suitable epitaxial crystal growth technique such as MOCVD. Referring to FIG. 4, the following layers are grown, in the order given on the substrate 9 of FIG. 1:

| Layer | Thickness | Composition | Reference Layers |
| --- | --- | --- | --- |
| 96 | 2000 Å | $Al_{0.15}Ga_{0.85}As$ | 10 |
| 98 | 2000 Å | $Al_{0.4}Ga_{0.6}As$ | 11 |
| 100 | 8000 Å | $Al_{0.85}Ga_{0.15}As$ | 12 |
| 101 | 900 Å | $Al_{0.40}Ga_{0.60}As$ | 14, 28 |

-continued

| Layer | Thickness | Composition | Reference Layers |
| --- | --- | --- | --- |
| 102 | 80 Å | $Al_{0.10}Ga_{0.90}As$ | 16, 30 |
| 103 | 900 Å | $Al_{0.40}Ga_{0.60}As$ | 18, 32 |
| 104 | 50 Å | $Al_{0.15}Ga_{0.85}As$ | 20, 34 |
| 105 | 40 Å | $Al_{0.85}Ga_{0.15}As$ | 36 |
| 106 | 250 Å | $Al_{0.30}Ga_{0.70}As$ | 38 |
| 107 | 100 Å | GaAs | 40 |
| 108 | 900 Å | $Al_{0.30}Ga_{0.70}As$ | 42 |
| 109 | 50 Å | $Al_{0.15}Ga_{0.85}As$ | 44 |
| 110 | 6000 Å | $Al_{0.85}Ga_{0.15}As$ | None |
| 111 | 1000 Å* | GaAs | None |

*not critical

The reference layers given in the table indicate that those layers in FIG. 1 correspond to the layer given in the table. Thus, the layer in the table must be doped as described with regards to FIG. 1.

Since they will be completely etched away, it is not necessary to grow the layers 110 and 111. However, the layers 110 and 111 facilitate testing the topmost active region as a single-wavelength emitter prior to the fabrication of a multicolor device. Also, growing the layer 110 on top of the layer 109 helps maintain the cleanliness of the top surface of the layer 109.

After fabrication of the structure shown in FIG. 4, the layer 111 is removed using a suitable etchant. A suitable etchant is one that selectively etches layer 111 much more quickly than the layer 110; etchants such as citric acid:hydrogen peroxide or ammonium hydroxide:hydrogen peroxide having ratios of constituents such that they etch layer 111 (GaAs) much faster than layer 110 ($Al_{0.85}Ga_{0.15}As$) are acceptable. Alternatively, it would be possible to use an etchant that etches both layers 111 and 110, but with an etch time such that all of layer 111, but only part of layer 110, is removed. An example of such an etchant is the commonly used etchant system of sulfuric acid:hydrogen peroxide:water.

Figure 5:
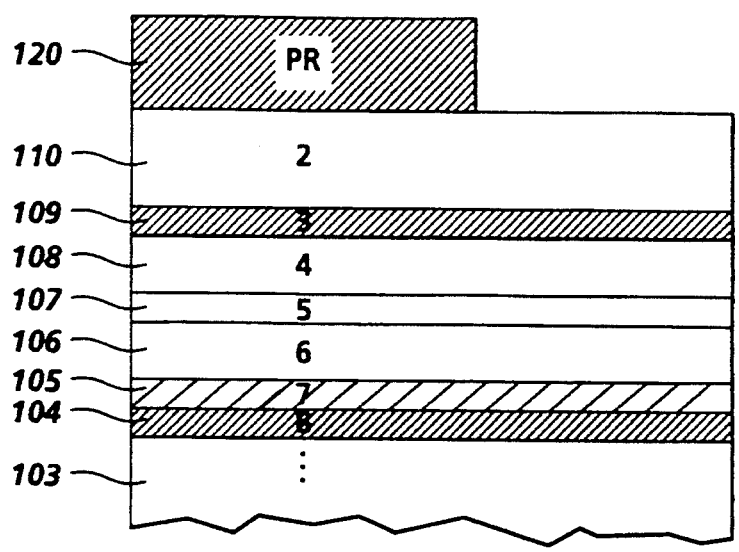
FIG. 5 shows the upper part of the structure of FIG. 4 after an etching step and deposition of an etch mask.
Figure 6:
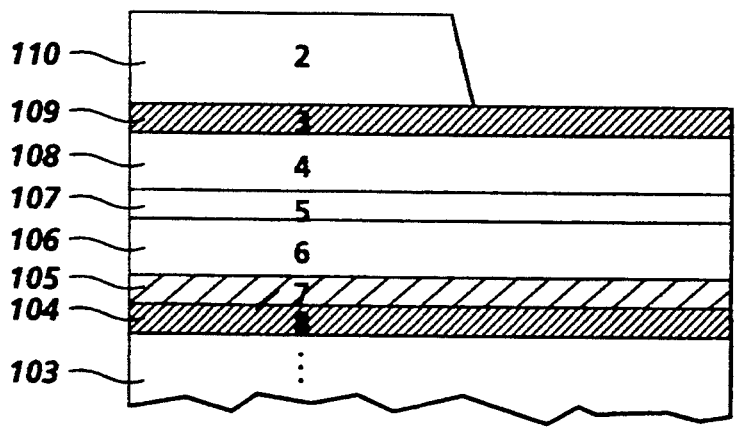
FIG. 6 shows the structure of FIG. 5 after an etching step and removal of the remaining etch mask.

Referring now to FIGS. 4 and 5, after removal of the layer 111, the top surface of the resulting structure is patterned, using a suitable etch mask 120, such as a photoresist, with openings where it is desired to locate the first stack (in FIG. 1, layers 14 through 26 inclusive) and part of the confinement region 54 on either side of the first stack. A selective etchant is then used to etch through the exposed layer 110 to the layer 109, the first etch stop layer. This selective etch could be a hydrofluoric acid based etchant such as buffered oxide etch. The etch masking layer (photoresist) is then removed, leaving an exposed portion of the layer 109 as shown in FIG. 6.

Figure 7:
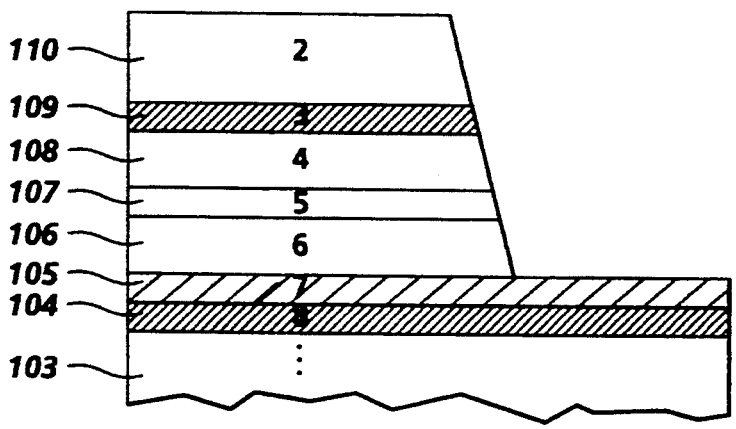
FIG. 7 shows the structure of FIG. 6 after an etching step.

The remaining and exposed portions of the layer 110 serve as an etch mask for the next etch step. That next etch removes the layers 109, 108, 107, and 106, from the area not under the layer 110, see FIG. 7. The preferred etchant is a citric acid/water:hydrogen peroxide mixture. To prepare that mixture, a citric acid solution is formed using equal parts, by weight, of citric acid monohydrate and water. Then, the citric acid/water solution is combined with hydrogen peroxide in a ratio of citric acid/water solution to peroxide of 16:1 by volume.

Figure 8:
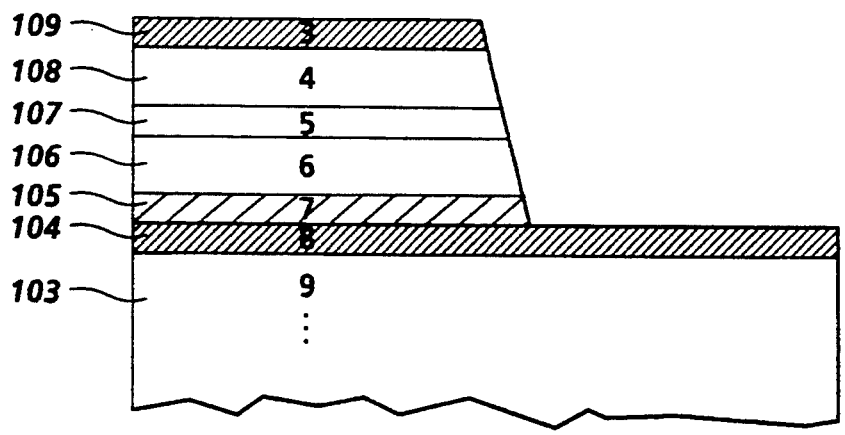
FIG. 8 shows the structure of FIG. 7 after an etching step.
Figure 9:
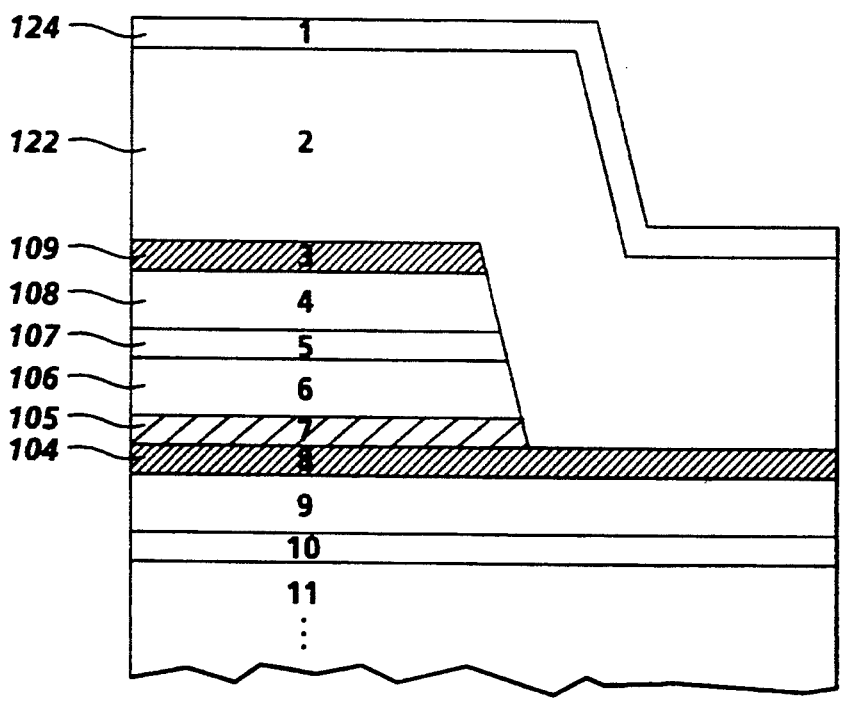
FIG. 9 shows the structure of FIG. 8 after growth of layers over the exposed surfaces.

Next, the exposed areas of layer 105 (see FIG. 7) and the remaining portions of the layer 110 are removed using a selective etchant, such as a buffered oxide etchant that etches the layers 110 and 105, but not the layer 104, see FIG. 8. Layers 122 and 124, similar to the layers 110 and 111, respectively, are then grown over the terraced surface formed by the layers 109 and 104 (in FIG. 8) to complete the epitaxial layer structure of the monolithic array shown in FIG. 1, see FIG. 9.

The etch stop layers 104 and 109 serve a dual purpose. First, they are barriers to the etchant that removes the layers above. Second, and importantly, they serve as relatively aluminum-free surfaces for the final growth. If these low-aluminum-containing layers were not included, the growth over exposed layers of higher-aluminum fraction would be problematic. In the case of the neighboring pair of etch stop layers 104 and 105, the lower layer, 104, facilitates the growth, while the layer 105 enables selective removal of the active region layers above it.

One particularly appealing feature of the method of fabricating a stacked active region monolithic laser array using the method given above is that, until the last etching step, the patterning and etching are carried out such that all regrowth surfaces in the growth plane are protected by an overlying epitaxial layer. Thus, the risk of contamination during the subsequent processing steps is reduced.

After growth of the layers 122 and 124, the confining regions 54 of FIG. 1 are formed using impurity-induced layer disordering. First, a layer of silicon nitride is deposited over the layer 124. Then, using an etch mask, the silicon nitride layer is removed from the areas into which silicon is to be diffused, thereby exposing portions of the layer 124. Next, a layer of silicon is deposited over the exposed portions of the layer 124 and the remaining silicon nitride layer. Then, another silicon nitride layer is formed over the just deposited silicon. Layer disordering proceeds by heating the structure in a furnace. The silicon in contact with the layer 124 is driven into the layers below, causing the desired disordering. Fabrication is then completed by providing separate contacts for each stack and cleaving to form the optical cavity.

From the foregoing, numerous modifications and variations of the principles of the present invention will be obvious to those skilled in its art. Therefore the scope of the present invention is to be defined by the appended claims.

What is claimed is:

1. A semiconductor structure, comprising:
   a substrate,
   a lower cladding layer over said substrate;
   a lower active region over said lower cladding layer;
   a lower etch stop layer over said lower active region;
   an upper active region adjacent said lower etch stop layer;
   an upper etch stop layer over said upper active region;
   an upper cladding layer over said upper active region; and
   wherein said upper and lower cladding layers serve as cladding layers for both said upper and lower active regions.

2. The structure of claim 1, further comprising:
   a capping layer over said upper cladding layer;
   an upper metallic contact over said capping layer; and
   a lower metallic contact over the bottom of said substrate.

3. The structure of claim 2, wherein said lower and upper active regions include layers of $Al_xGa_{1-x}As$, wherein $0 \leq X \leq 1$.

4. The structure of claim 2, wherein said lower and upper active regions include layers of $In_xGa_yAl_zAs$, wherein $0 \leq X \leq 1$, wherein $0 \leq Y \leq 1$, wherein $0 \leq Z \leq 1$, and wherein $X+Y+Z=1$.

5. A semiconductor laser structure having an optical resonator, said laser structure comprising:
   a substrate,
   a lower cladding layer over said substrate for providing transverse optical confinement;
   a lower active region over said lower cladding layer, said lower active region having a first bandgap;
   a lower etch stop layer over said lower active region;
   an upper active region adjacent said lower etch stop layer, said upper active region having a second bandgap which is less than said first bandgap;
   an upper etch stop layer over said upper active region;
   an upper cladding layer over said upper active region for providing transverse optical confinement;
   a capping layer over said upper cladding layer for providing improved electrical contact;
   an upper metallic contact over said capping layer for providing a first input terminal to said upper and lower active regions; and
   a lower metallic contact over the bottom of said substrate for providing a second input terminal to said upper and lower active regions;
   wherein current flow between said upper and lower metallic contacts passes through said upper and lower active regions such that said upper active region lases.

6. The semiconductor laser structure according to claim 5, further including a confinement layer around said lower and upper active regions for providing lateral carrier and optical confinement.

7. The structure of claim 6, wherein said lower and upper active regions include layers of $Al_xGa_{1-x}As$ wherein $0 \leq X \leq 1$.

8. The structure of claim 6, wherein said lower and upper active regions include layers of $In_xGa_yAl_zAs$, wherein $0 \leq X \leq 1$, wherein $0 \leq Y \leq 1$, wherein $0 \leq Z \leq 1$, and wherein $X+Y+Z=1$.

9. A semiconductor laser array having two optical resonators, said laser array comprising:
   a substrate,
   a lower cladding layer over said substrate for providing transverse optical confinement;
   a first stack over said lower cladding layer, said first stack comprised of;
   a first active region over said lower cladding layer and having a first bandgap;
   a first etch stop layer over said first active region;
   a first upper cladding layer over said first etch stop layer for providing transverse optical confinement;
   a first capping layer over said first upper cladding layer for providing improved electrical contact to said first upper cladding layer;
   a first upper metallic contact over said first capping layer for providing an input terminal to said first stack;
   a second stack over said lower cladding layer, said second stack comprised of;
   a second active region over said lower cladding layer and having a bandgap equal to said first bandgap;
   a second etch stop layer over said second active region;
   a third active region over said second etch stop layer and having a bandgap which is less than said first bandgap;
   a third etch stop layer over said third active region;
   a second upper cladding layer over said third etch stop layer for providing transverse optical confinement;
   a second capping layer over said second upper cladding layer for providing improved electrical contact to said second upper cladding layer;
   a second upper metallic contact over said second capping layer for providing an input terminal to said second stack; and
   a lower metallic contact over the bottom of said substrate for providing a common terminal for said first and second stacks;
   wherein current flow between said first metallic contact and said lower metallic contact cause the first active region to emit laser light at a first color, and wherein current flow between said second metallic contact and said lower metallic contact cause the third active region to emit laser light at a second color.

10. The semiconductor laser structure according to claim 9, further including a confinement layer around said first and second stacks for providing lateral carrier and optical confinement.

11. The structure of claim 10, wherein said first, second and third active regions include layers of $Al_xGa_{1-x}As$.

12. The structure of claim 10, wherein said first, second, and third active regions include layers of $In_xGa_yAl_{1-x-y}As$.

* * * * *

UNITED STATES PATENT AND TRADEMARK OFFICE
CERTIFICATE OF CORRECTION

PATENT NO. : 5,386,428
DATED : January 31, 1995
INVENTOR(S) : Robert L. Thornton, et al It is certified that error appears in the above-indentified patent and that said Letters Patent is hereby corrected as shown below:

In column 1, line 3, insert the following paragraph:

--The U.S. Government has certain rights in the invention as provided by the terms of Advanced Technololgy Program Award 70NANB2H1241 awarded by the Department of Commerce.--

Signed and Sealed this

Nineteenth Day of September, 1995

Attest:

BRUCE LEHMAN

Attesting Officer

Commissioner of Patents and Trademarks

UNITED STATES PATENT AND TRADEMARK OFFICE
CERTIFICATE OF CORRECTION

| | |
|---|---|
| PATENT NO. | : 5,386,428 |
| APPLICATION NO. | : 08/146651 |
| DATED | : January 31, 1995 |
| INVENTOR(S) | : Robert L. Thornton et al. |

It is certified that error appears in the above-identified patent and that said Letters Patent is hereby corrected as shown below:

Column 1, line 4, insert as a new paragraph:

This invention was made with Government support under Agreement No. 70NANB2H1241 awarded by the Department of Commerce. The Government has certain rights in this invention.

Signed and Sealed this

Eighth Day of August, 2006

JON W. DUDAS
*Director of the United States Patent and Trademark Office*